US008598792B2

(12) United States Patent
Ren et al.

(10) Patent No.: US 8,598,792 B2

(45) Date of Patent: Dec. 3, 2013

(54) DRIVING CIRCUIT FOR POWERING LED LIGHT SOURCES

(75) Inventors: Zhimou Ren, Chengdu (CN); Ching-Chuan Kuo, Taipei (TW); Tiesheng Yan, Chengdu (CN); Yunning Xie, Chengdu (CN); Jun Ren, Chengdu (CN)

(73) Assignee: O2Micro Inc., Santa Clara, CA (US)

( * ) Notice: Subject to any disclaimer, the term of this patent is extended or adjusted under 35 U.S.C. 154(b) by 134 days.

(21) Appl. No.: 13/371,375

(22) Filed: Feb. 10, 2012

(65) Prior Publication Data

US 2012/0139422 A1 Jun. 7, 2012

(30) Foreign Application Priority Data

Dec. 20, 2011 (CN) .......................... 2011 1 0429790

(51) Int. Cl.
*H03K 19/086* (2006.01)

(52) U.S. Cl.
USPC ............ 315/126; 315/119; 315/127; 315/136

(58) Field of Classification Search
None
See application file for complete search history.

(56) References Cited

U.S. PATENT DOCUMENTS

| | | | | |
|---|---|---|---|---|
| 2002/0186194 | A1 | 12/2002 | Baek et al. | |
| 2010/0219766 | A1* | 9/2010 | Kuo et al. | 315/224 |
| 2011/0221346 | A1* | 9/2011 | Lee et al. | 315/122 |

FOREIGN PATENT DOCUMENTS

| | | | |
|---|---|---|---|
| CN | 101527990 | A | 9/2009 |
| CN | 101868094 | A | 10/2010 |
| CN | 101965074 | A | 2/2011 |
| CN | 102238766 | A | 11/2011 |
| CN | 202026503 | U | 11/2011 |

* cited by examiner

*Primary Examiner* — Anh Tran

(57) ABSTRACT

Embodiments of the invention provided a driving circuit for powering a light-emitting diode (LED) light source. The driving circuit includes a rectifier, a filter capacitor, and a control circuit. The rectifier converts an AC voltage from an AC power source to a rectified AC voltage. The filter capacitor coupled to the rectifier filters the rectified AC voltage to provide a DC voltage. The control circuit controls power supplied to the LED light source. The control circuit enables a discharging current periodically to discharge the filter capacitor if a switch coupled between an AC power source and a rectifier is turned off and disables the discharging current if the control circuit determines that the switch is turned on.

20 Claims, 8 Drawing Sheets

DRIVING CIRCUIT FOR POWERING LED LIGHT SOURCES

RELATED APPLICATIONS

This application claims priority to Chinese Patent Application No. 201110429790.1, titled "Driving Circuit, Control Circuit, and Control Method for LED Light Source," filed on Dec. 20, 2011, with the State Intellectual Property Office of the People's Republic of China.

BACKGROUND

In lighting application fields, an illuminating indicator in an illuminated switch can be used to indicate the position of the illuminated switch. FIG. 1 shows a conventional lighting circuit 100. An illuminated switch module 103 includes a switch 108, a current limiting resistor 104, and an indicator 106, e.g., a light-emitting diode (LED). The lighting circuit 100 uses an incandescent lamp 110 as a light source. The current limiting resistor 104 is coupled to the indicator 106 in series. The current limiting resistor 104 and the indicator 106 are coupled to the switch 108 in parallel. When the switch 108 is turned off, a current flows through the current limiting resistor 104, the indicator 106, and the incandescent lamp 110. Because the current is relatively small, the indicator 106 is on and the incandescent lamp 110 is off.

In recent years, more and more LED light sources are used instead of incandescent lamps. FIG. 2 shows a conventional LED driving circuit 200. Elements labeled the same as FIG. 1 have similar functions. The LED driving circuit 200 includes an illuminated switch module 103, an AC/DC converter (e.g., including a bridge rectifier 210 and a filter capacitor 212), a control circuit 214, a DC/DC converter 216, and a capacitor 218. The bridge rectifier 210 is operable for converting an AC voltage from an AC power source 102 to a rectified AC voltage. The filter capacitor 212 is coupled with the bridge rectifier 210 in parallel to filter the rectified AC voltage and to provide a first DC voltage VDC1. The control circuit 214, e.g., a chip, includes a control unit 222, a charging circuit 224, a switch 226, and a bias circuit 228. The control unit 222 is operable for generating a first control signal CTR1 to control the DC/DC converter 216 and generating a second control signal CTR2 to control the bias circuit 228. The bias circuit 228 receiving the second control signal CTR2 is operable for turning the switch 226 on and off. The DC/DC converter 216 controlled by the first control signal CTR1 converts the first DC voltage VDC1 to a second DC voltage VDC2 which is supplied to an LED string 220 and a third DC voltage VDC3 which is supplied to the control circuit 214 and the capacitor 218.

When the switch 108 is turned on, initially the DC/DC converter 216 is disabled and the capacitor 218 is charged by a current from the capacitor 212 and from the power source 102 via the charging circuit 224. A voltage VDD of the capacitor 218 is applied to the control circuit 214. When the voltage VDD of the capacitor 218 increases to a threshold voltage $VDD_{ON}$, the control unit 222 is enabled. The control unit 222 generates the first control signal CTR1 to enable the DC/DC converter 216 and generates the second control signal CTR2 to turn off the switch 226. Since the DC/DC converter 216 is enabled, the capacitor 218 is charged by the DC/DC converter 216, e.g., a transformer.

When the switch 108 is off, a current flows through the current limiting resistor 104, the indicator 106, and the bridge rectifier 210. The current through the indicator 106 is relatively small because the resistor 104 has a relatively large resistance. The gate voltage of the switch 226 increases as the voltage across the capacitor 212 increases. When the gate voltage of the switch 226 increases to the turn-on threshold, the switch 226 is turned on by the bias circuit 228, and thus a current from the resistor 104 and the capacitor 212 charges the capacitor 218 through the switch 226 and the charging circuit 224. The voltage across the capacitor 218 increases accordingly. When the voltage VDD is greater than the threshold voltage $VDD_{ON}$, the control unit 222 is enabled. The control unit 222 generates the first control signal CTR1 to enable the DC/DC converter 216 and generates the second control signal CTR2 to turn off the switch 226. Thus, the DC/DC converter 216 generates the second DC voltage VDC2 to the LED string 220 and the third DC voltage VDC3 to the capacitor 218 and the control circuit 214. The LED string 220 is powered on.

The voltage across the capacitor 218 and the capacitor 212 decreases due to a power consumption of the control circuit 214 and the LED string 220. When the voltage VDD is less than a voltage $VDD_{OFF}$, the control unit 222 is disabled, and thus the control unit 222 stops generating the first control signal CTR1 and the second control signal CTR2. Therefore, the DC/DC converter 216 is disabled—it stops supplying the second DC voltage VDC2 to the LED string 220. The LED string 220 is powered off. Then, the next cycle begins—the capacitor 212 is charged again, the switch 226 is turned on again, the control unit 222 is enabled again. Consequently, when the switch 108 is off, the control unit 222 is enabled periodically and the LED string 220 is powered on periodically, which causes undesired flashes.

SUMMARY

Embodiments of the invention provided a driving circuit for powering a light-emitting diode (LED) light source. The driving circuit includes a rectifier, a filter capacitor, and a control circuit. The rectifier converts an AC voltage from an AC power source to a rectified AC voltage. The filter capacitor coupled to the rectifier filters the rectified AC voltage to provide a DC voltage. The control circuit controls power supplied to the LED light source. The control circuit enables a discharging current periodically to discharge the filter capacitor if a switch coupled between an AC power source and a rectifier is turned off and disables the discharging current if the control circuit determines that the switch is turned on.

BRIEF DESCRIPTION OF THE DRAWINGS

Features and advantages of embodiments of the invention will become apparent as the following detailed description proceeds, and upon reference to the drawings, where like numerals depict like elements, and in which.

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Figure 1:
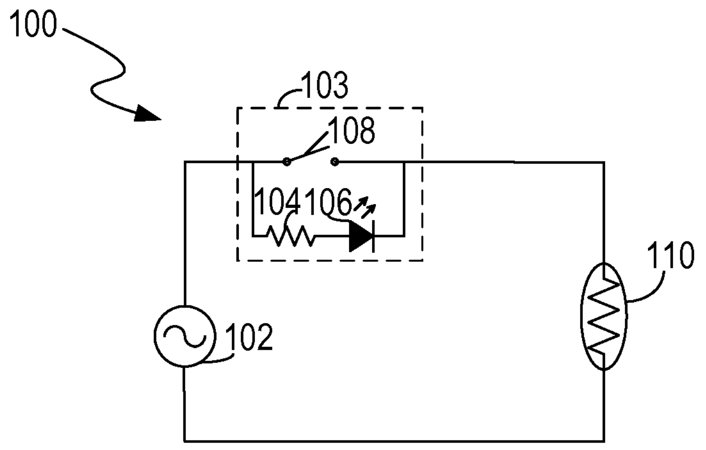
FIG. 1 PRIOR ART
FIG. 1 illustrates an example of a conventional lighting circuit.
Figure 2:
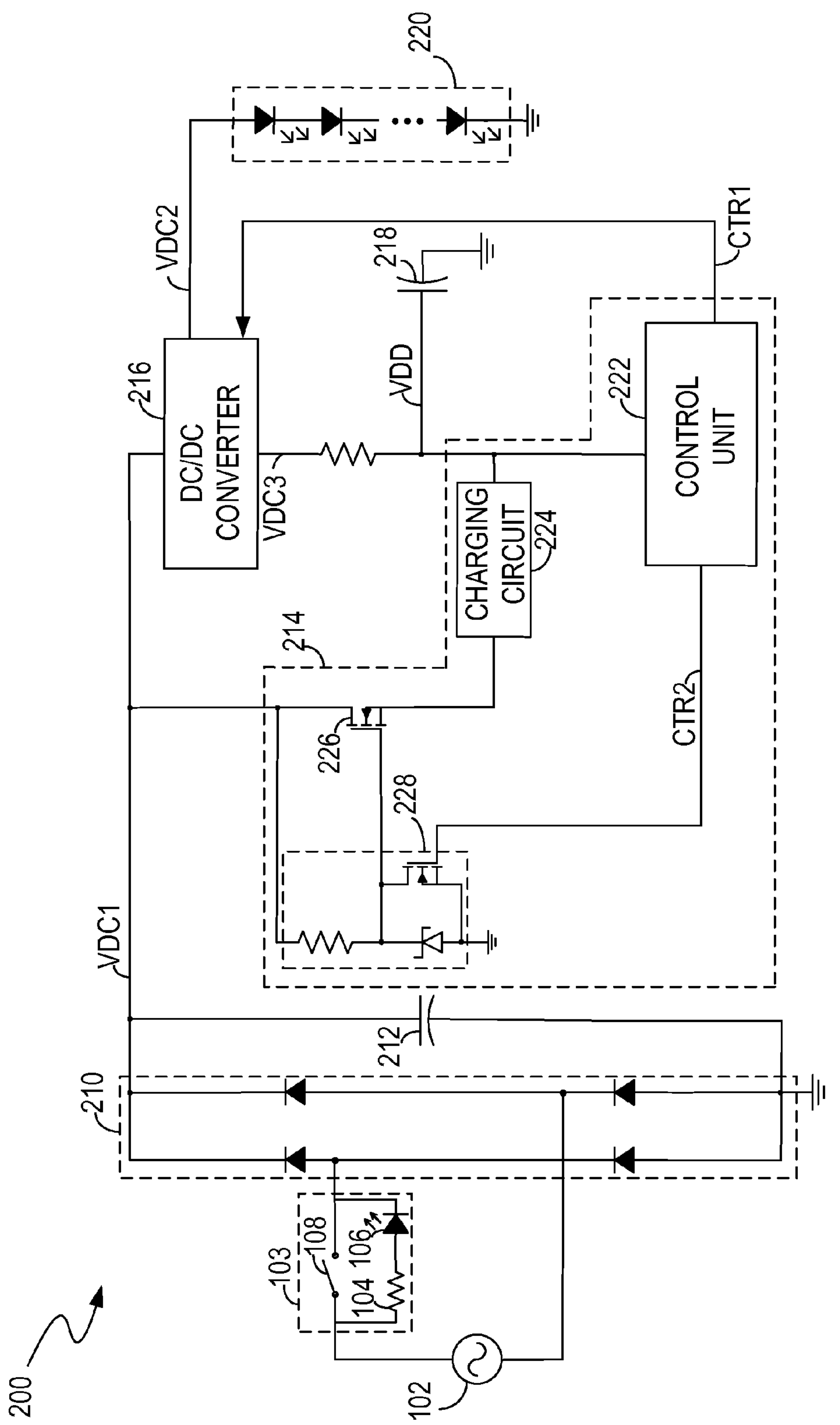
FIG. 2 PRIOR ART
FIG. 2 illustrates an example of a conventional LED driving circuit.
Figure 3:
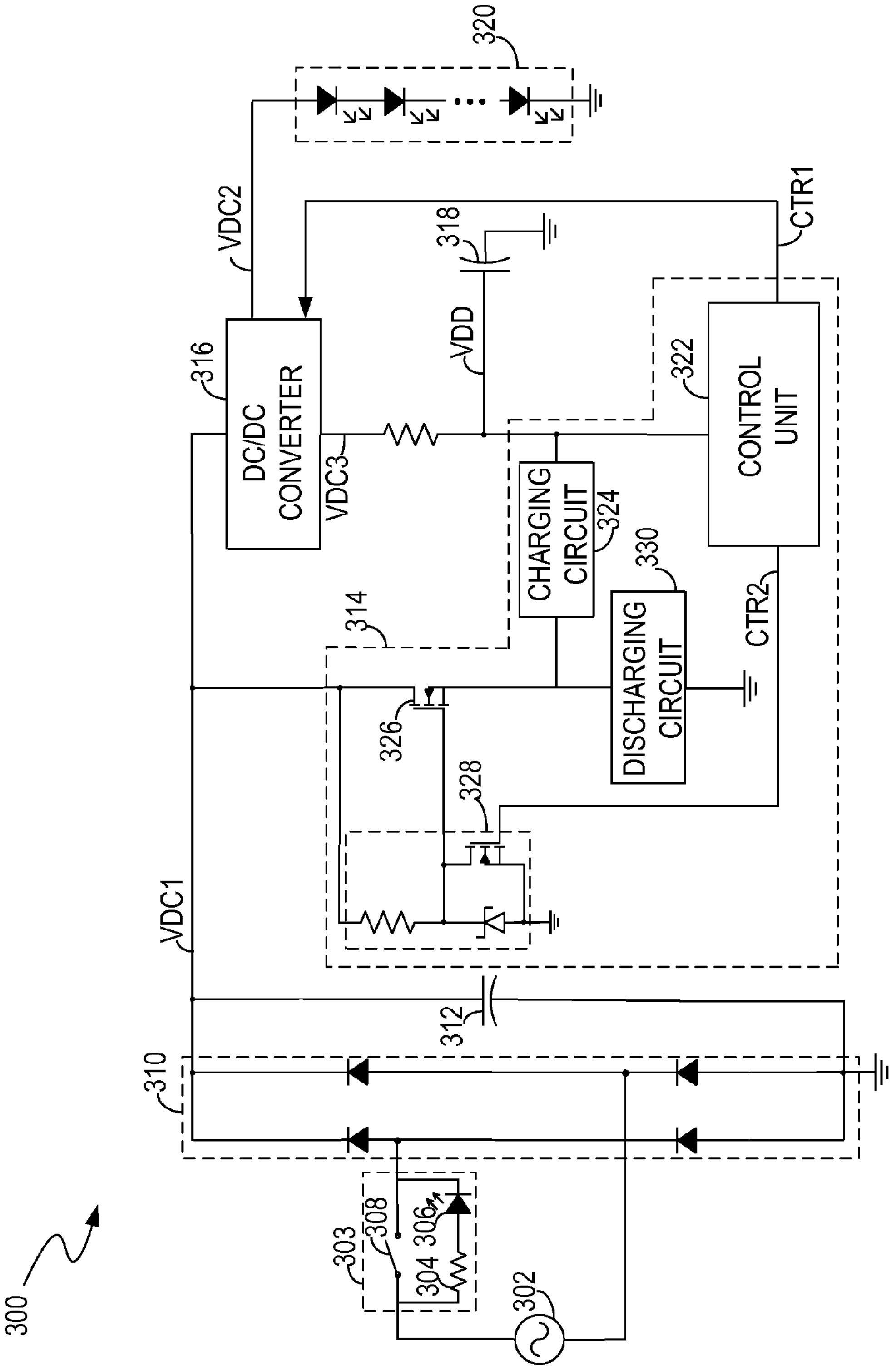
FIG. 3 illustrates an example of a driving circuit for powering a load, in accordance with one embodiment of the present invention.

FIG. 3 illustrates a driving circuit 300 for powering a load, in accordance with one embodiment of the present invention. The driving circuit 300 includes an illuminated switch module 303, an AC/DC converter (e.g., including a bridge rectifier 310 and a filter capacitor 312), a control circuit 314, a DC/DC converter 316, and an energy storage element, e.g., a capacitor 318. The illuminated switch module 303 includes a switch 308, a current limiting resistor 304, and an indicator 306. In the example of FIG. 3, the indicator 306 is an LED. However, other types of light source can be used as the indicator 306. The current limiting resistor 304 and the indicator 306 are coupled to the switch 308 in parallel. The bridge rectifier 310 is operable for converting an AC voltage from an AC power source 302 to a rectified AC voltage. The capacitor 312 is coupled to the bridge rectifier 310 in parallel to filter the rectified AC voltage to provide a first DC voltage VDC1.

The DC/DC converter 316, e.g., a transformer, controlled by the control circuit 314, receives the first DC voltage VDC1 and generates a second DC voltage VDC2 to power a load, e.g., an LED string 320. The DC/DC converter 316 further generates a third DC voltage VDC3 to the control circuit 314 and the capacitor 318.

The control circuit 314, e.g., a chip, is operable for controlling power supplied to the LED string 320 by controlling the output voltage of the DC/DC converter 316. In one embodiment, the control circuit 314 includes a control unit 322, a charging circuit 324, a switch 326, a bias circuit 328, and a discharging circuit 330. The control unit 322 is operable for generating a first control signal CTR1 to control the DC/DC converter 316 and for generating a second control signal CTR2 to control the bias circuit 328. The bias circuit 328 is operable for turning the switch 326 on and off. When a gate voltage of the switch 326 increases to a turn-on threshold, the switch 326 is turned on by the bias circuit 328. When the control unit 322 generates the second control signal CTR2, the bias circuit 328 turns off the switch 326. The switch 326 can be a metal-oxide-semiconductor field-effect transistor (MOSFET). The charging circuit 324 is operable for charging the capacitor 318 when the switch 326 is on. In one embodiment, the charging circuit 324 is unidirectional, so the capacitor 312 cannot be charged by the capacitor 318 via the charging circuit 324.

In the example of FIG. 3, the capacitor 318 is operable for providing a voltage VDD to the control circuit 314. In one embodiment, when the control unit 322 generates the first control signal CTR1 to enable the DC/DC converter 316 and generates the second control signal CTR2 to turn off the switch 326, the capacitor 318 is charged by the DC/DC converter 316. If the DC/DC converter 316 is disabled, the capacitor 318 can be charged by a current from the filter capacitor 312 via the charging circuit 324 when the switch 326 is on. In one embodiment, when the voltage VDD rises to a threshold voltage $VDD_{ON\_HIGH}$, the control unit 322 generates the first control signal CTR1 and the second control signal CTR2. The control unit 322 stops generating the first control signal CTR1 and the second control signal CTR2 when the voltage VDD drops to a threshold voltage $VDD_{OFF\_HIGH}$. The threshold voltage $VDD_{ON\_HIGH}$ is greater than the threshold voltage $VDD_{OFF\_HIGH}$.

The control circuit 314 detects whether the switch 308 is on or off. Advantageously, the discharging circuit 330, coupled to a node between the switch 326 and the charging circuit 324, enables a discharging current, e.g., periodically, to discharge the filter capacitor 312 if the switch 308 is turned off, in one embodiment. The discharging circuit 330 disables the discharging current if the discharging circuit 330 determines that the switch 308 is turned on. As a result, the voltage VDD is maintained less than the threshold voltage $VDD_{ON\_HIGH}$ such that the control unit 322 does not generate the first control signal CTR1, the DC/DC converter 316 remains disabled when the switch 308 is turned off. Consequently, the LED string 320 remains off when the switch 308 is turned off.

More specifically, in operation, when the switch 308 is off, a current which flows through the current limiting resistor 304, the indicator 306, and the bridge rectifier 310 charges the capacitor 312. The current through the indicator 306 is relatively small because the resistor 304 has a relatively large resistance. The gate voltage of the switch 326 increases as the voltage across the capacitor 312 increases. When the gate voltage of the switch 326 increases to a turn-on threshold, the switch 326 is turned on by the bias circuit 328, and thus a current from the power source 302 and the capacitor 312 charges the capacitor 318 through the switch 326 and the charging circuit 324. The voltage across the capacitor 318 increases accordingly.

In one embodiment, when the voltage VDD increases to a threshold voltage $VDD_{ON\_LOW}$, the control unit 322 is enabled. The discharging circuit 330 enables a discharging current to discharge the capacitor 312 via the switch 326 and the discharging circuit 330. The voltage of the capacitor 312 decreases relatively fast, and at some point the capacitor 312 stops charging the capacitor 318, and the voltage VDD stops rising. The voltage VDD gradually decreases due to the power consumption of the control circuit 314. When the voltage VDD decreases to the threshold voltage $VDD_{OFF\_LOW}$, the control unit 322 is disabled. In one embodiment, the threshold voltage $VDD_{ON\_LOW}$ is greater than the threshold voltage $VDD_{OFF\_LOW}$. Accordingly, the discharging current from the capacitor 312 through the switch 326 to ground is cut off. Then, the voltage of the capacitor 312 increases again, and the next cycle begins. In one embodiment, the threshold voltage $VDD_{OFF\_HIGH}$ is greater than the threshold voltage $VDD_{ON\_LOW}$. In one embodiment, the DC/DC converter 316 remains disabled if the voltage VDD remains less than the voltage $VDD_{ON\_HIGH}$. Advantageously, the voltage VDD remains less than the voltage $VDD_{ON\_HIGH}$ when the switch 308 is off. Thus, when the switch 308 is off, the control unit 322 is enabled and disabled alternately, but the DC/DC converter 316 remains disabled and thus the LED string 320 remains off.

If the switch 308 is turned on, the voltage across the capacitor 312 increases relatively fast. In one embodiment, the discharging circuit 330 detects that the switch 308 is on if the discharging current exceeds a threshold for a predetermined time period. Upon detecting that the switch 308 is on, the discharging circuit 330 disables the discharging current from the capacitor 312 and from the power source 302 through the switch 326 to ground. Because the voltage across the capacitor 312 remains relatively high, the capacitor 312 continues to charge the capacitor 318, and the voltage VDD continues to increase. When the voltage VDD increases above a threshold voltage $VDD_{ON\_HIGH}$, the control unit 322 generates a first control signal CTR1 to enable the DC/DC converter 316 and generates a second control signal CTR2 to turn off the switch 326. Thus, the DC/DC converter 316 generates an output voltage VDC2 to power on the LED string 320. When the DC/DC converter 316 is enabled, the capacitor 318 is charged by the DC/DC converter 316.

Figure 4:
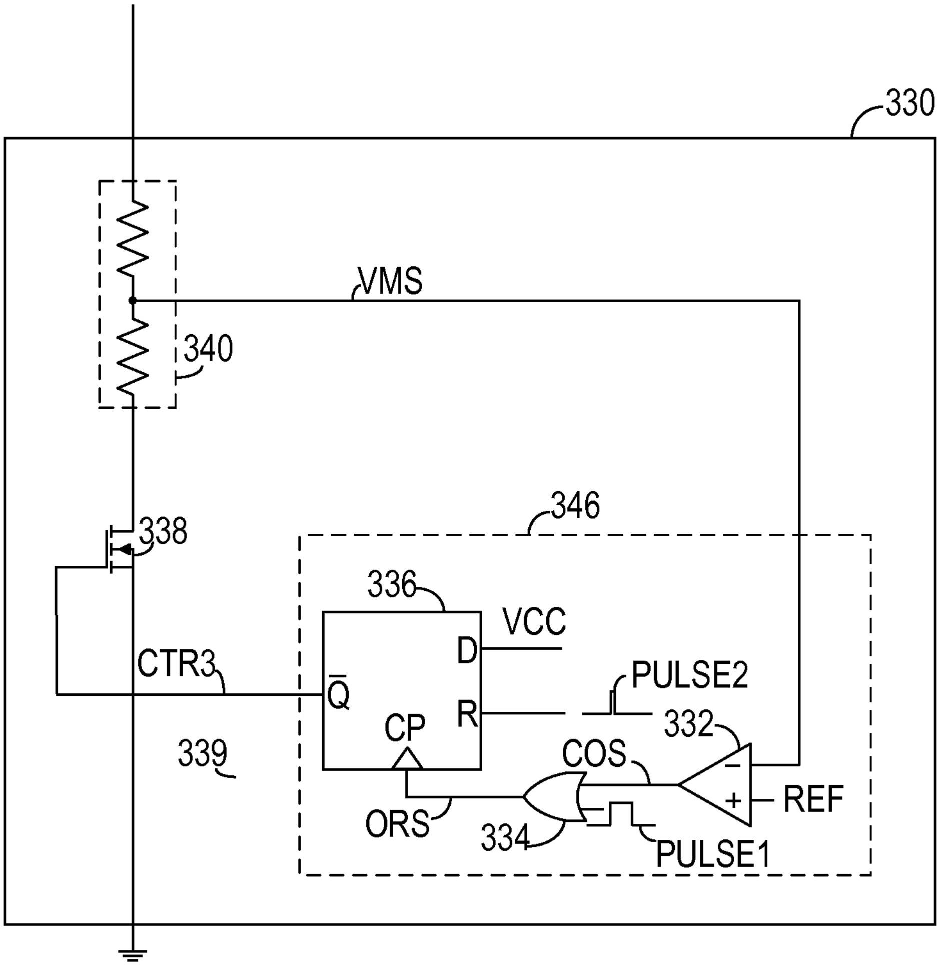
FIG. 4 illustrates an example of a discharging circuit in FIG. 3, in accordance with one embodiment of the present invention.

FIG. 4 illustrates an example of a discharging circuit 330 in FIG. 3, in accordance with one embodiment of the present invention. FIG. 4 is described in combination with FIG. 3. The discharging circuit 330 is operable for enabling a discharging current flowing through the discharging switch 338 to discharge the filter capacitor 312, e.g., periodically, if the switch 308 is off. The discharging circuit 330 is operable for disabling the discharging current if the discharging circuit 330 determines that the switch 308 is turned on. The discharging circuit 330 includes a discharging switch 338, a voltage sensor 340, and a detecting circuit 346. The discharging switch 338 can be a MOSFET, which controls the discharging current flowing through it according to a control signal CTR3. The voltage sensor 340 is operable for generating a monitoring signal VMS indicating the discharging current. The detecting circuit 346 is operable for generating the control signal CTR3 to control the switch 338 based on the monitoring signal VMS. The voltage sensor 340 is coupled with the switch 338 in series.

In the example of FIG. 4, the voltage sensor 340 is a voltage divider, and the detecting circuit 346 includes a comparator 332, a logic gate, e.g., an OR gate 334, and a D flip-flop 336. The comparator 332 is operable for comparing a reference signal REF with the monitoring signal VMS and generating a comparison output signal COS. The reference signal REF indicates a current threshold TH. The monitoring signal VMS indicates the discharging current flowing through the discharging switch 338. The OR gate 334 is operable for receiving the comparison output signal COS and a first pulse signal PULSE1 having a first predetermined width, and operable for generating an output signal ORS. The first predetermined width lasts for a predetermined time period T. The D flip-flop includes a CP terminal for receiving the output signal ORS from the OR gate 334, an R terminal for receiving a second pulse signal PULSE2 having a second predetermined width, and a D terminal for receiving a logic high signal VCC. In one embodiment, a logic high signal VCC is generated by the control circuit 314 when the control unit 322 is enabled. The D flip-flop 336 is operable for generating a control signal CTR3 to control the discharging switch 338 based on the output signal from the OR gate 334 and based on the second pulse signal PULSE2. In the example of FIG. 4, if the D flip-flop 336 receives a pulse signal from the R terminal, the Q output signal of the D flip-flop 336 remains logic high until the D flip-flop 336 receives a signal with a negative falling edge from the CP terminal. If the D flip-flop 336 receives a signal with a negative falling edge from the CP terminal, the Q output signal of the D flip-flop 336 is an inverse of the input signal received at the D terminal. Thus, if the D terminal receives the logic high signal VCC, the Q output signal is set to logic low in response to the negative falling edge at the CP terminal. In one embodiment, the second predetermined width is less than the first predetermined width. In one embodiment, the signal VCC, the first pulse signal PULSE1, and the second pulse signal PULSE2 are generated by the control unit 322 or other elements in the control circuit 314.

Figure 5:
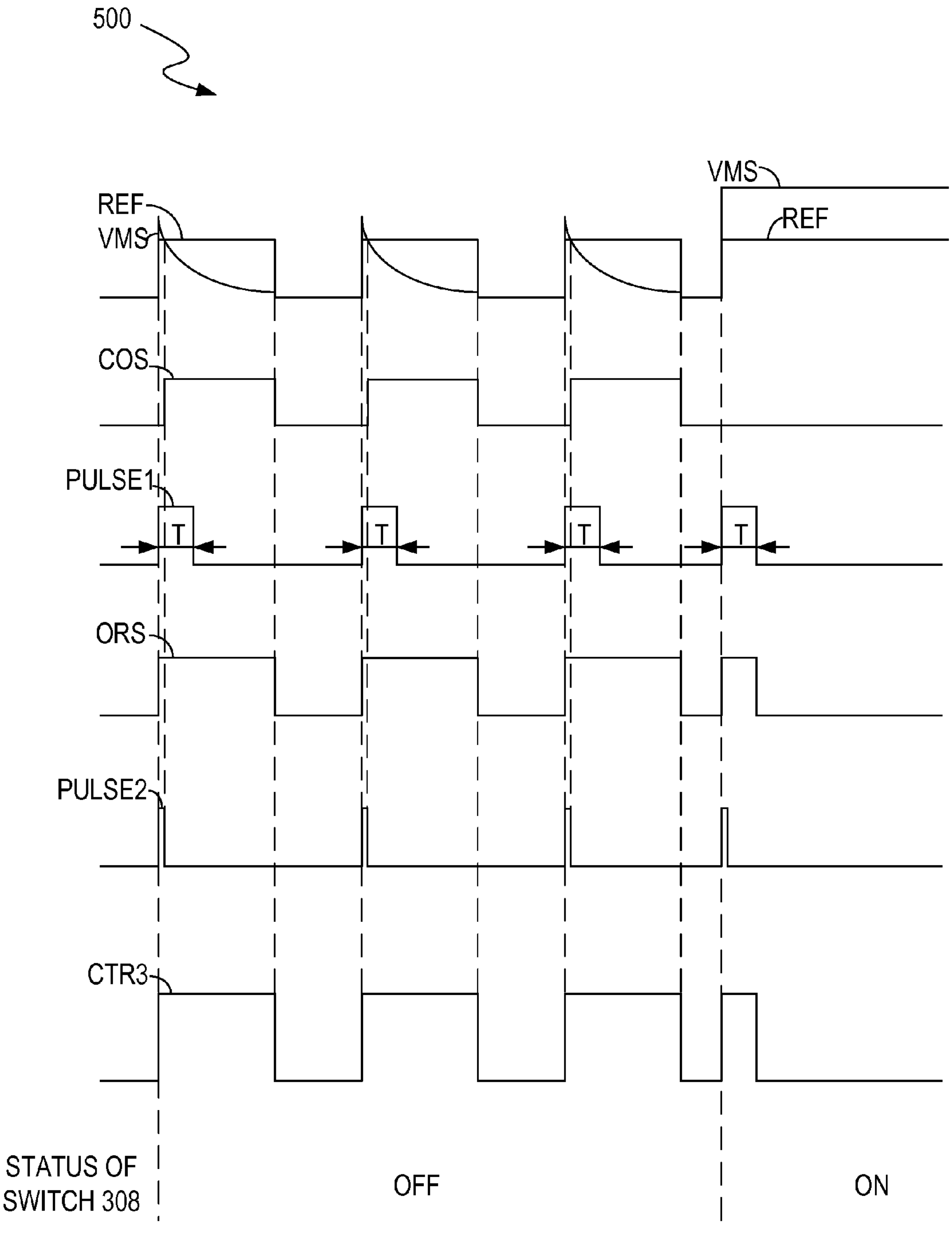
FIG. 5 shows examples of signal waveforms of signals associated with a discharging circuit in FIG. 4, in accordance with one embodiment of the present invention.

FIG. 5 shows examples of signal waveforms of signals associated with the discharging circuit 330, and is described in combination with FIG. 3 and FIG. 4. In operation, if the switch 308 is off and the voltage VDD rises to the threshold voltage $VDD_{ON\_LOW}$, the control unit 322 is enabled to provide the first pulse signal PULSE1 and the second pulse signal PULSE2 simultaneously, in one embodiment. The OR gate 334 receives the first pulse signal PULSE1 and the D flip-flop 336 receives the second pulse signal PULSE2. The discharging switch 338 is turned on in response to the second pulse signal PULSE2, and thus the discharging current is enabled. Because the current through the indicator 306 is relatively small, the discharging current is less than the current threshold TH at the end of the predetermined time period T. Accordingly, after the predetermined time period T, the monitoring signal VMS from the voltage sensor 340 is less than the reference voltage REF which indicates the current threshold TH. Therefore, the comparison output signal COS remains logic high after the predetermined time period T. The output signal ORS of the OR gate 334 remains logic high. The third control signal CTR3 remains logic high. Thus, the discharging circuit 330 keeps the discharging switch 338 conducted to discharge the capacitor 312. The voltage of the capacitor 312 decreases relatively fast, and at some point the capacitor 312 stops charging the capacitor 318, and the voltage VDD stops rising.

The voltage VDD decreases gradually due to the power consumption of the control circuit 314 and the voltage VDD remains less than a voltage threshold $VDD_{ON\_HIGH}$ when the switch 308 is off. Therefore, the control unit 322 does not generate the first control signal CTR1, the DC/DC converter 316 remains disabled, and the LED string 320 remains off. When the voltage VDD decreases to the voltage $VDD_{OFF\_LOW}$, the control unit 322 is disabled. As such, the third control signal CTR3 turns to logic low, and the discharging switch 338 is turned off to cut off the discharging current. Then, the voltage of the capacitor 312 increases again, and the next cycle begins.

If the switch 308 is turned on, the voltage across the capacitor 312 increases relatively fast. When the voltage VDD rises to a threshold voltage $VDD_{ON\_LOW}$, the control unit 322 is enabled to provide the first pulse signal PULSE1 and the second pulse signal PULSE2 simultaneously, in one embodiment. The OR gate 334 receives the first pulse signal PULSE1 and the D flip-flop 336 receives the second pulse signal PULSE2. The discharging switch 338 is turned on in response to the second pulse signal PULSE2, and thus the discharging current is enabled. Because the current from the capacitor 312 and from the power source 302 is relatively large, and the discharging current remains greater than the current threshold TH. Thus, the monitoring signal VMS remains greater than the reference voltage REF, the comparison output signal COS remains logic low, and the output signal ORS of the OR gate 334 includes a negative falling edge at the end of the predetermined time period T. The third control signal CTR3 turns to logic low in response to the negative falling edge. Consequently, the discharging switch 338 is turned off. In other words, if the discharging current exceeds the current threshold TH for a predetermined time period T, the discharging circuit 330 determines that the switch 308 is turned on. Because the voltage across the capacitor 312 remains relatively high, the capacitor 312 continues to charge the capacitor 318, and the voltage VDD continues to increase. When the voltage VDD increases above the threshold voltage $VDD_{ON\_HIGH}$, the control unit 322 generates the first control signal CTR1 to enable the DC/DC converter 316 and generates the second control signal CTR2 to turn off the switch 326. Thus, the DC/DC converter 316 generates the output voltage VDC2 to power on the LED string 320.

Figure 6:
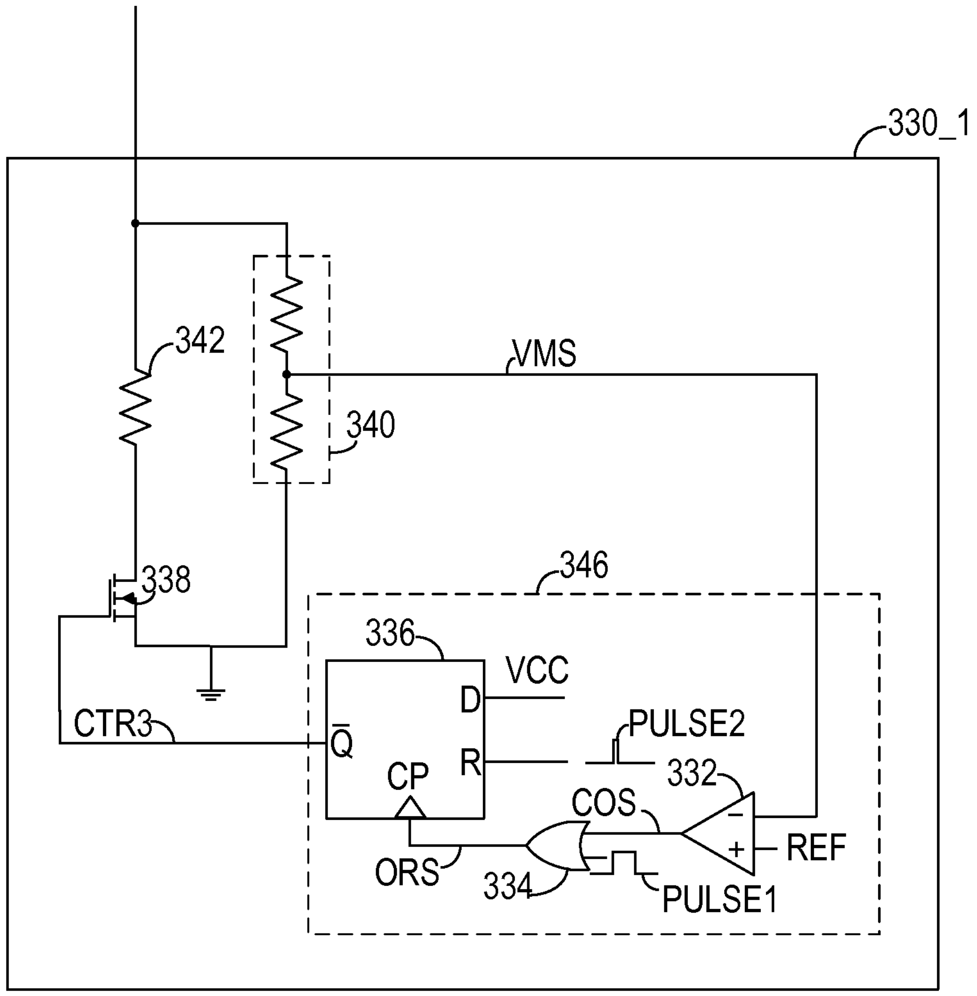
FIG. 6 illustrates another example of a discharging circuit in FIG. 3, in accordance with one embodiment of the present invention.

FIG. 6 illustrates another example of a discharging circuit 330_1 in FIG. 3, in accordance with one embodiment of the present invention. Elements that are labeled the same as in FIG. 4 have similar functions. The discharging circuit 330_1 is similar to the discharging circuit 330 in FIG. 4 except that a resistor 342 is coupled to the switch 338 in series and the voltage sensor 340 is coupled to the resistor 342 and the switch 338 in parallel. Because the resistor of the voltage sensor 340 is much greater than the resistor 342, the power consumption of the voltage sensor 340 is negligible when the switch 308 is turned on.

Figure 7:
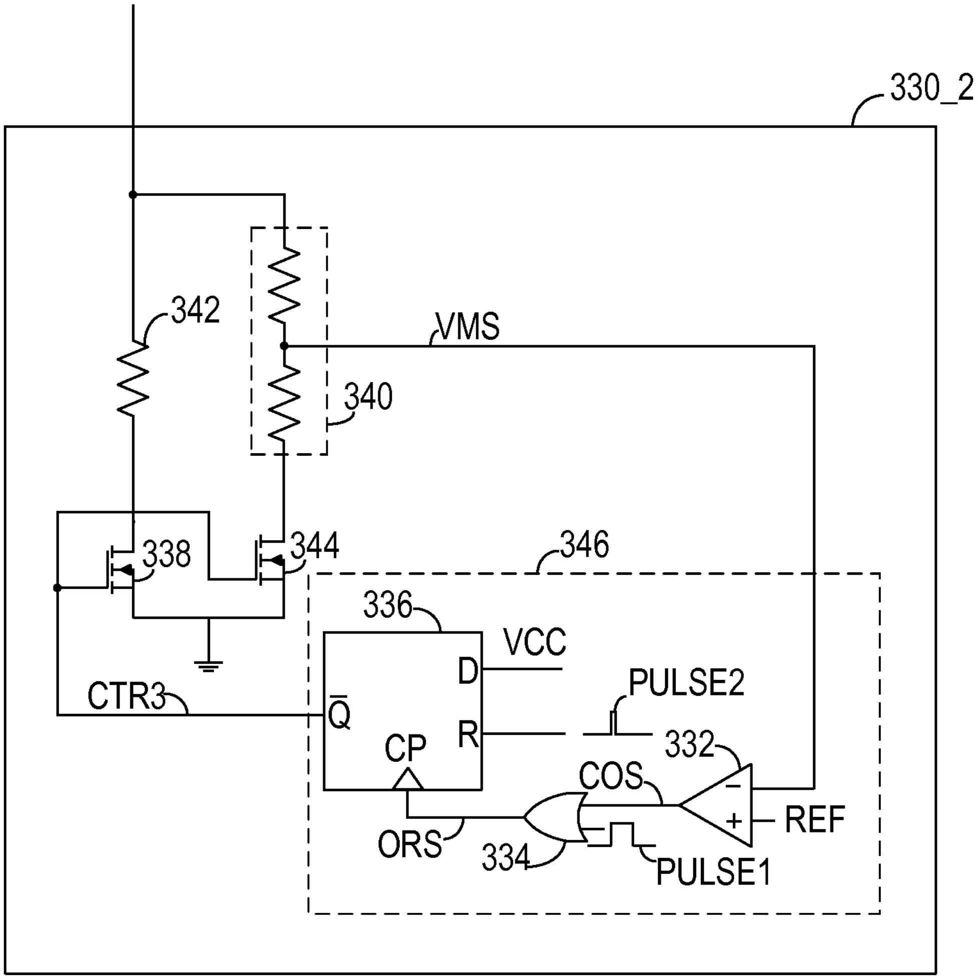
FIG. 7 illustrates another example of a discharging circuit in FIG. 3, in accordance with one embodiment of the present invention.

FIG. 7 illustrates another example of a discharging circuit 330_2 in FIG. 3, in accordance with one embodiment of the present invention. Elements that are labeled the same as in FIG. 6 have similar functions. The discharging circuit 330_2 is similar to the discharging circuit 330_1 in FIG. 6 and further includes a switch 344 coupled to the voltage sensor 340 in series. The switch 344 is controlled by the control signal CTR3. When the switch 308 is turned on, the switch 344 is turned off by the control signal CTR3, and thus the power consumption of the voltage sensor 340 is further reduced or eliminated.

Figure 8:
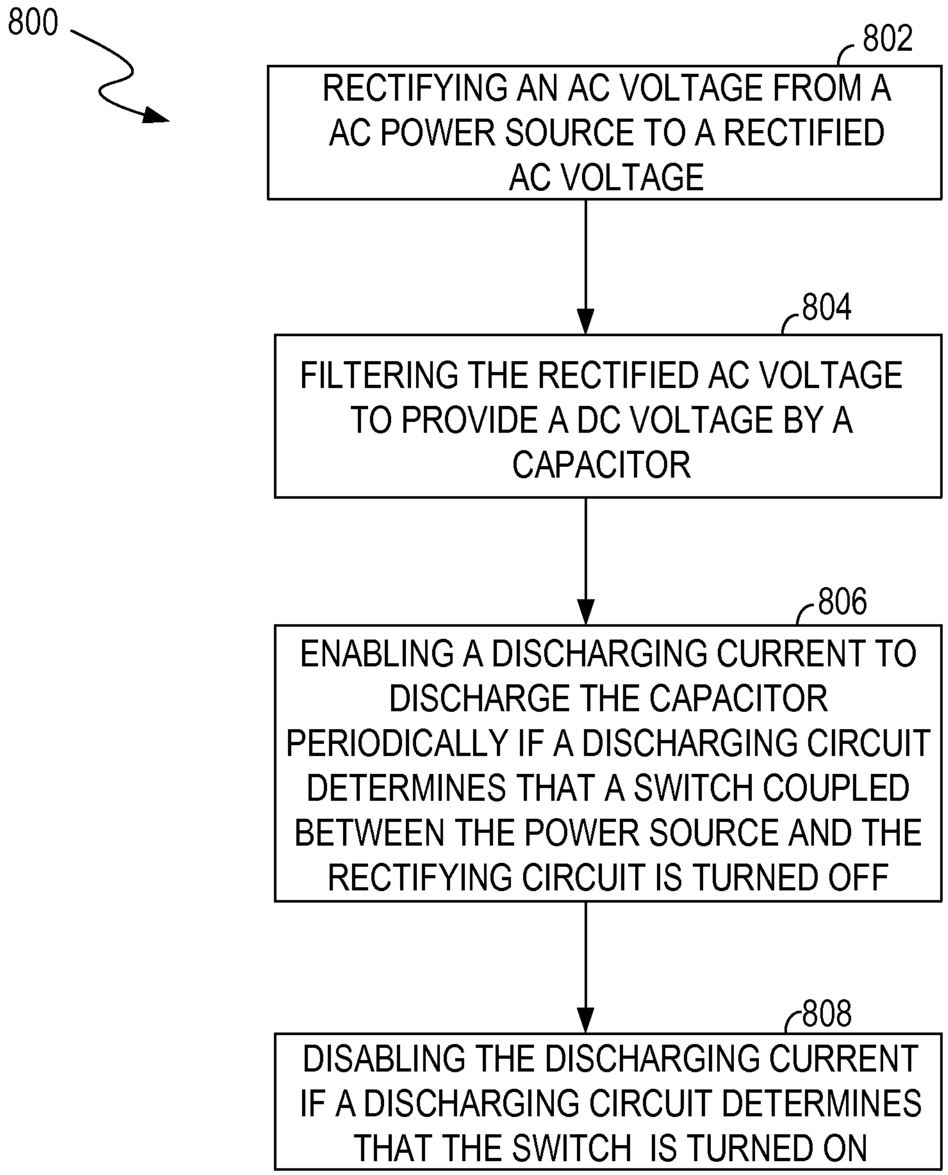
FIG. 8 illustrates a flowchart of a method for controlling power to a load, in accordance with one embodiment of the present invention.

FIG. 8 illustrates a flowchart 800 of a method for controlling power to a light source, e.g., an LED light source, in accordance with one embodiment of the present invention. FIG. 8 is described in combination with FIG. 3. In block 802, a bridge rectifier 310 rectifies an AC voltage from an AC power source 302 to a rectified AC voltage. In block 804, a capacitor 312 filters the rectified AC voltage to provide a DC voltage. In block 806, if a switch 308 coupled between the AC power source 302 and the rectifier 310 is turned off, a discharging circuit 330 enables a discharging current periodically to discharge the capacitor 312. In block 808, if the discharging circuit 330 determines that the switch 308 is turned on, the discharging circuit 330 disables the discharging current. In one embodiment, if the discharging current exceeds a current threshold TH for a predetermined time period T, the discharging circuit 330 determines that the switch 308 is turned on.

Accordingly, the present invention provides an LED driving circuit with a discharging circuit. When a filter capacitor is charged by a current through an indicator of an illuminated switch during the illuminated switch is off, the filter capacitor is discharged by the discharging circuit. Advantageously, the flashes of the LED light source are avoided when the illuminated switch is off.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A driving circuit for powering a light-emitting diode (LED) light source, said driving circuit comprising:
- a rectifier that converts an AC voltage from an AC power source to a rectified AC voltage;
- a filter capacitor, coupled to said rectifier, that filters said rectified AC voltage to provide a DC voltage; and
- a control circuit that controls power supplied to said LED light source, wherein said control circuit enables a discharging current periodically to discharge said filter capacitor if a switch coupled between said AC power source and said rectifier is turned off, and wherein said control circuit disables said discharging current if said control circuit determines that said switch is turned on.

2. The driving circuit as claimed in claim 1, wherein said control circuit determines that said switch is turned on if said discharging current exceeds a threshold for a predetermined time period.

3. The driving circuit as claimed in claim 2, wherein said control circuit comprises a comparator that compares a monitoring signal indicating said discharging current with a reference signal indicating said threshold.

4. The driving circuit as claimed in claim 3, wherein said control circuit comprises a discharging switch that controls said discharging current based on a control signal, and wherein said discharging switch is turned off if said monitoring signal exceeds said reference signal for said predetermined time period.

5. The driving circuit as claimed in claim 4, wherein said control circuit further comprises a logic gate that receives a first pulse signal and an output signal from said comparator, and wherein a pulse width of said first pulse signal lasts said predetermined time period.

6. The driving circuit as claimed in claim 5, wherein said control circuit further comprises a flip-flop that receives an output signal from said logic gate and a second pulse signal, and generates said control signal to control said discharging switch.

7. The driving circuit as claimed in claim 6, wherein said pulse width of said first pulse signal is greater than a pulse width of said second pulse signal.

8. The driving circuit as claimed in claim 1, further comprising:
- a DC/DC converter, coupled to said filter capacitor, that receives said DC voltage and provides an output voltage to power said LED light source,
- wherein said DC/DC converter remains disabled such that said LED light source remains off when said switch is off.

9. The driving circuit as claimed in claim 8, further comprising:
- an energy storage element that provides a voltage to said control circuit, and that is capable of being charged by said filter capacitor if said switch is off.

10. The driving circuit as claimed in claim 9, wherein when said switch is off, a voltage of said energy storage element remains below a converter threshold such that said DC/DC converter remains disabled.

11. The driving circuit as claimed in claim 9, wherein when said switch is off, said discharging current is enabled if said voltage of said energy storage element reaches to an enabling threshold, and is disabled if said voltages of said energy storage element drops to a disabling threshold.

12. A control circuit for controlling power to a light-emitting diode (LED) light source, said control circuit comprising:

a control unit that controls a DC/DC converter that receives an input voltage and generates a regulated output voltage to power said LED light source; and a discharging circuit, coupled to said control unit, that enables a discharging current periodically to discharge a filter capacitor if a switch coupled between an AC power source and a rectifier is turned off, and wherein said discharging circuit disables said discharging current if said discharging circuit determines that said switch is turned on, wherein said rectifier rectifies an AC voltage from said AC power source and provides a rectified AC voltage, and wherein said filter capacitor filters said rectified AC voltage to provide said input voltage.

13. The control circuit as claimed in claim 12, wherein said discharging circuit determines that said switch is turned on if said discharging current exceeds a threshold for a predetermined time period.

14. The control circuit as claimed in claim 12, wherein said discharging circuit comprises a comparator that compares a monitoring signal indicating said discharging current with a reference signal indicating a threshold.

15. The control circuit as claimed in claim 14, wherein said discharging circuit comprises a discharging switch that controls said discharging current based on a control signal, and wherein said discharging switch is turned off if said monitoring signal exceeds said reference signal for a predetermined time period.

16. The control circuit as claimed in claim 15, wherein said discharging circuit further comprises a logic gate that receives a first pulse signal and an output signal from said comparator, and wherein a pulse width of said first pulse signal lasts said predetermined time period.

17. The control circuit as claimed in claim 16, wherein said discharging circuit further comprises a flip-flop that receives an output signal from said logic gate and a second pulse signal, and generates said control signal to control said discharging switch.

18. The control circuit as claimed in claim 12, wherein when said switch is off, a voltage of an energy storage element that is provided to said control unit remains below a converter threshold such that said DC/DC converter remains disabled.

19. A method for controlling power to a light-emitting diode (LED) light source, said method comprising:

rectifying an AC voltage from an AC power source to a rectified AC voltage;

filtering said rectified AC voltage to provide a DC voltage by a capacitor;

converting said DC voltage to an output voltage to power said LED light source;

enabling a discharging current periodically to discharge said capacitor if a switch coupled between said AC power source and a rectifier is turned off; and disabling said discharging current if a discharging circuit determines that said switch is turned on.

20. The method as claimed in claim 19, further comprising:

determining that said switch is turned on if said discharging current exceeds a threshold for a predetermined time period.

* * * * *